United States Patent
Ichikawa

(10) Patent No.: US 8,647,906 B2
(45) Date of Patent: Feb. 11, 2014

(54) METHOD FOR MANUFACTURING A LIGHT EMITTING DEVICE

(71) Applicant: Nichia Corporation, Anan (JP)

(72) Inventor: Masatsugu Ichikawa, Tokushima (JP)

(73) Assignee: Nichia Corporation, Anan-Shi (JP)

( * ) Notice: Subject to any disclaimer, the term of this patent is extended or adjusted under 35 U.S.C. 154(b) by 0 days.

(21) Appl. No.: 13/959,834

(22) Filed: Aug. 6, 2013

(65) Prior Publication Data

US 2013/0316478 A1    Nov. 28, 2013

Related U.S. Application Data

(62) Division of application No. 12/970,355, filed on Dec. 16, 2010.

(30) Foreign Application Priority Data

Dec. 17, 2009   (JP) .............................. P 2009-285971

(51) Int. Cl.
*H01L 21/00*    (2006.01)

(52) U.S. Cl.
USPC .. 438/46; 257/98; 257/E33.061; 257/E33.067

(58) Field of Classification Search
USPC ................. 438/34–47; 257/97–99, E33.061, 257/E33.067
See application file for complete search history.

(56) References Cited

U.S. PATENT DOCUMENTS

| | | | |
|---|---|---|---|
| 5,998,925 A | 12/1999 | Shimizu et al. | |
| 6,686,676 B2 | 2/2004 | McNulty et al. | |
| 7,258,816 B2 * | 8/2007 | Tamaki et al. | 252/301.4 F |
| 7,791,093 B2 | 9/2010 | Basin et al. | |
| 2009/0256166 A1 * | 10/2009 | Koike et al. | 257/98 |
| 2009/0278147 A1 * | 11/2009 | Suzuki | 257/98 |

FOREIGN PATENT DOCUMENTS

| | | |
|---|---|---|
| JP | 2002-141559 A | 5/2002 |
| JP | 3503139 B2 | 3/2004 |
| JP | 2008-130279 A | 6/2008 |
| JP | 2009-24117 A | 2/2009 |
| WO | WO 02/089175 A1 | 11/2002 |
| WO | WO 2007/018039 A1 | 2/2007 |
| WO | WO 2008/020575 A1 | 2/2008 |

OTHER PUBLICATIONS

Japanese Office Action (including partial English translation), mailed Aug. 6, 2013, for corresponding Japanese Patent Application No. 2009-285971.
US Office Action issued in co-pending U.S. Appl. No. 12/970,355 on May 30, 2012.
Office Action issued in co-pending U.S. Appl. No. 12/970,355 on Nov. 5, 2012.

* cited by examiner

*Primary Examiner* — Brook Kebede
(74) *Attorney, Agent, or Firm* — Birch, Stewart, Kolasch & Birch, LLP

(57) ABSTRACT

A method of manufacturing a light emitting device, the method including: disposing a semiconductor light emitting element including a semiconductor layer that emits a primary light on a mounting substrate; covering the semiconductor light emitting element with a transparent medium containing fluorescent material particles that absorb a part of the primary light and emits a secondary light having a wavelength longer than that of the primary light and scattering particles having a mean particle size D that satisfies the inequality 20 nm<D≤0.4×λ/π, where λ is the wavelength of the primary light propagating in the transparent medium; and precipitating the fluorescent material particles so as to form a fluorescent layer where the fluorescent material particles are mainly dispersed in the transparent medium and a scattering layer where the scattering particles are mainly dispersed in the transparent medium.

8 Claims, 6 Drawing Sheets

METHOD FOR MANUFACTURING A LIGHT EMITTING DEVICE

This application is a Divisional of co-pending application Ser. No. 12/970,355 filed on Dec. 16, 2010, and for which priority is claimed under 35 U.S.C. §120; which claims priority from P 2009-285971 filed in Japan on Dec. 17, 2009; the entire contents of all these applications being hereby incorporated by reference.

BACKGROUND OF THE INVENTION

1. Field of the Invention

The present invention relates to a light emitting device capable of color-mixing light emitted by a light emitting element and light obtained through wavelength conversion of a part of the original light, thereby emitting light of a different color.

2. Description of the Related Art

A semiconductor light emitting element such as light emitting diode is small in size, has high power efficiency and emits light with clear color. The semiconductor light emitting element also has such advantages as excellent startup performance and high durability to vibration and repetitive operations of turning on and off. Light emitting devices have been developed that are capable of emitting light of various colors by combining the primary light of the semiconductor light emitting element and a fluorescent material capable of emitting secondary light of a different wavelength through excitation by the primary light, based on the principle of color mixing of light. Such light emitting devices are used as various light sources. Particularly in recent years, as such light emitting devices are spotlighted as the next-generation illumination of lower power consumption and longer service life that replaces the fluorescent lamps, it is required to further improve the output power of light emission and the emission efficiency. There is also a demand for light source of higher brightness in projectors such as headlight of automobile and flood lighting.

Such a light emitting device includes a semiconductor light emitting element die-bonded onto a metallic lead frame or a ceramic substrate and a fluorescent material layer formed around the semiconductor light emitting element by various methods such as potting, screen printing or the like. Japanese Patent Publication No. 3,503,139, for example, discloses a light emitting device that emits white light and has high durability and high color rendering performance, constituted by combining a light emitting diode formed from a gallium nitride-based compound semiconductor that is capable of emitting blue light as the primary light and a garnet fluorescent material activated with cerium that is capable of emitting yellow light as the secondary light. FIG. 10 is a sectional view of a light emitting device 100 disclosed in Japanese Patent Publication No. 3,503,139, that comprises a light emitting diode 102 fastened at a distal end of 105 of a pair of lead frames 105, 106, and a fluorescent material layer 101 that is formed from a resin containing fluorescent material particles and coats the light emitting diode. The light emitting diode 102 and the fluorescent material layer 101 are coated by a bullet-shaped transparent resin 104. Japanese Unexamined Patent Publication (Kokai) No. 2002-141559 discloses such a constitution as a powder of silica, alumina or titania is dispersed as scattering particles in the transparent resin that coats the semiconductor light emitting element and the fluorescent material layer, in order to mitigate color unevenness of the light emitting device that has a semiconductor light emitting element and a fluorescent material layer. Japanese Unexamined Patent Publication (Kokai) No. 2009-24117 discloses such a constitution as fine particles measuring 20 nm or less that is formed from an inorganic material having a high refractive index are dispersed in the transparent resin and in the fluorescent material layer, in order to increase the refractive indices of the transparent resin and the fluorescent material layer thereby to improve light extracting efficiency. According to Japanese Unexamined Patent Publication (Kokai) No. 2009-24117, the particle size of the fine particles is set to 20 nm or less in order to suppress the scattering of light. Japanese Unexamined Patent Publication (Kokai) No. 2008-130279 discloses such a constitution as the particle size of fluorescent material particles contained in the fluorescent material layer is set to a small size that corresponds to the Rayleigh scattering regime, thereby to improve the light extracting efficiency.

However, it has been difficult to improve the color unevenness and light extracting efficiency of the light emitting device at the same time, in the light emitting device of the prior art described above. First, in such a light emitting device of the prior art as that of Japanese Patent Publication No. 3,503,139, the semiconductor light emitting element and the fluorescent material layer are coated with the transparent resin, and epoxy, silicone or the like is often used as the transparent resin. These transparent resins show excellent optical properties such as colorless transparency, homogeneity and high isotropy after curing, although the excellent optical properties allow the emission intensity distribution of the semiconductor light emitting element and the fluorescent material layer to be shown faithfully to the outside. Meanwhile, a difference between the emission intensity distribution of the semiconductor light emitting element and the emission intensity distribution of the fluorescent material layer is likely to arise, and it is not easy to make both emission intensity distributions to be identical. Since chromaticity of light emitted by the light emitting device is determined by the ratio of intensity of the secondary light emitted by the fluorescent material layer to the intensity of primary light emitted by the semiconductor light emitting element, presence of difference in emission intensity distribution between the semiconductor light emitting element and the fluorescent material layer causes the chromaticity to change with the position within the light emitting device and with the direction of viewing the light emitting device, thus resulting in color unevenness.

Japanese Unexamined Patent Publication (Kokai) No. 2002-141559 discloses the constitution where scattering particles are dispersed in the transparent resin that coats the semiconductor light emitting element and the fluorescent material layer, in order to improve the color unevenness. When the scattering particles are dispersed in the transparent resin, light of the semiconductor light emitting element and light of the fluorescent material layer are scattered so that the emission intensity distribution of each member is made more uniform and the color unevenness is suppressed. However, although a large quantity of scattering particles dispersed in the transparent resin can improve the color unevenness, it leads to a problem of lower light extracting efficiency. That is, the scattering particles dispersed in the transparent resin scatter the light of the semiconductor light emitting element and the fluorescent material layer in every direction. As a result, the proportion of light returning to the semiconductor light emitting element and the fluorescent material layer also increases. Light returning to the semiconductor light emitting element and the fluorescent material layer are finally extracted to the outside of the light emitting device after being reflected on various interfaces, while not a small proportion of the light is absorbed in this process. As a result, intensity of light extracted to the outside of the light emitting device at the end decreases, thus resulting in lower light extracting efficiency. In Japanese Unexamined Patent Publication (Kokai) No. 2009-24117 and Japanese Unexamined Patent Publication (Kokai) No. 2008-130279, although the means for improving light extracting efficiency is studied, no consideration is given to the color unevenness caused by the difference between the emission intensity distribution of the semiconductor light emitting element and the emission intensity distribution of the fluorescent material layer.

SUMMARY OF THE INVENTION

Accordingly, an object of the present invention is to provide a novel light emitting device that can improve both the color unevenness and light extracting efficiency of the light emitting device at the same time.

In order to achieve the object described above, the present inventors have intensively studied. As a result, they noticed a fundamental difference in emission intensity distribution between the semiconductor light emitting element and the fluorescent material layer, and found that the above object can be achieved by taking advantage of the difference.

First, the difference in emission intensity distribution between semiconductor light emitting element and fluorescent material layer will be described. The emission intensity distribution involves a distribution caused by the position within the light emitting surface (hereafter referred to as in-surface distribution) and a distribution caused by the direction of viewing the light emitting surface (hereafter referred to as light distribution characteristic). The primary light emitted from the semiconductor light emitting element such as light emitting diode is surface emission from the semiconductor layer, which is subjected to the influence of light blocking by an electrode, so that the in-surface distribution tends to be generated depending on the die shape and the electrode shape, while the light distribution characteristic tends to be non-uniform. Also because the primary light of the semiconductor light emitting element emits after passing through the fluorescent material layer, the in-surface distribution and the light distribution characteristic of light emission of the semiconductor light emitting element are affected also by means of the arrangement, thickness, shape or the like of the fluorescent material layer. On the other hand, the fluorescent material layer emits the secondary light of a longer wavelength by absorbing a part of the primary light of the light emitting diode, and therefore there is no need for complicated structure of electrode or the like, thus providing a high degree of freedom in the design of arrangement, thickness and shape. As a result, the in-surface distribution of the fluorescent material layer can be relatively freely controlled and the light distribution characteristic of the fluorescent material layer can be easily made uniform by adjusting the arrangement, thickness and shape or the like of the fluorescent material layer.

The difference described above becomes more conspicuous when the fluorescent material exists in the form of particles in the fluorescent material layer. When the fluorescent material exists in the form of particles, the secondary light is emitted in every direction from the fluorescent material particles. As a result, light distribution characteristic exhibited by the fluorescent material tends to become basically uniform, and does not change with the quantity of fluorescent material. Light emission distribution exhibited by the semiconductor light emitting element is surface emission from the semiconductor layer, and therefore the emission intensity distribution thereof tends to be non-uniform, and changes significantly with the quantity of fluorescent material disposed around the semiconductor light emitting element. This is because the fluorescent material particles behave as a scattering object as well as absorber of light of the semiconductor light emitting element. Therefore, when the quantity of fluorescent material is changed so as to change the ratio of light intensity of the semiconductor light emitting element and the light intensity of the fluorescent material layer and obtain the desired chromaticity, emission intensity distribution of the semiconductor light emitting element changes significantly as a consequence.

The present invention has been made by noticing the fundamental difference in the emission intensity distribution exhibited by the semiconductor light emitting element and the fluorescent material layer, and provides a light emitting device comprising a semiconductor light emitting element including a semiconductor layer that emits primary light; and
   a fluorescent material layer disposed on the light emitting side of the semiconductor light emitting element, that absorbs a part of the primary light and emits secondary light having a wavelength longer than that of the primary light, the light emitting device emitting light of blended color of the primary light and the secondary light, wherein
the light emitting device further comprises a scattering layer, in which particles are dispersed in a transparent medium, on the light emitting side of the fluorescent material layer, said particles having a mean particle size D that satisfies [Inequality 1]:

$$20\ \text{nm} < D < 0.4 \times \lambda/\pi \qquad \text{[Inequality 1]}$$

($\lambda$ is the wavelength of the primary light propagating in the transparent medium) and the scattering layer scatters the primary light and causes it to emit from the light emitting device.

The present invention is based on the notice of the fact that emission intensity distribution of the fluorescent material layer can easily be controlled by means of the arrangement, thickness and shape or the like of the fluorescent material layer, while emission intensity distribution of the semiconductor light emitting element tends to be non-uniform fundamentally and is affected also as the light passes through fluorescent material layer. Accordingly the present invention is characterized by the capability to selectively scatter the primary light of the semiconductor light emitting element by controlling the mean particle size D of the particles, dispersed in the transparent medium, within a predetermined range. To selectively scatter the primary light of the semiconductor light emitting element means scattering the primary light of the semiconductor light emitting element significantly more strongly than the secondary light of longer wavelength of the fluorescent material layer. It is preferable that the primary light is scattered twice more strongly than the secondary light.

Selectively scattering the primary light of the semiconductor light emitting element makes it possible to selectively control the emission intensity distribution of the semiconductor light emitting element. Therefore, since the present invention enables it to appropriately control the emission intensity distribution of the fluorescent material layer by means of the arrangement, thickness and shape thereof, and control the emission intensity distribution of the semiconductor light emitting element by means of the scattering layer independently of the emission intensity distribution of the fluorescent material layer, it is made possible to suppress the color unevenness by reducing the difference in emission intensity distribution between the semiconductor light emitting element and the fluorescent material layer. Also according to the present invention, since light of the fluorescent material layer is not scattered strongly by the scattering layer, it is made possible to reduce the light that returns to the semiconductor light emitting element and the fluorescent material layer due to excessive scattering, and suppress the light extracting efficiency from decreasing. As a result, the present invention makes it possible to suppress light extracting efficiency of the light emitting device from decreasing, thereby to improve the color unevenness and provide the light emitting device that is bright and has less color unevenness.

The particles used in the present invention also have an effect of increasing the refractive index and the heat conductivity of the material in which the particles are dispersed, while suppressing excessive scattering of visible light therein. Accordingly, reflection loss may also be reduced by dispersing the particles in various materials other than the scattering layer. For example, the particles may be dispersed in the fluorescent material layer per se, an adhesive that fastens the fluorescent material layer onto the semiconductor light emitting element and the die-bonding material that fastens the semiconductor light emitting element. The particles dispersed in these materials may have the same as or different from that of the particles dispersed in the scattering layer, as long as the mean particle size satisfies Inequality 1.

As described above, according to the present invention, in the light emitting device including the semiconductor light emitting element and the fluorescent material layer, since the scattering layer that scatters the primary light of the semiconductor light emitting element more strongly than the secondary light of the fluorescent material layer is provided, it is made possible to reduce the return light caused by excessive scattering of the secondary light of the fluorescent material layer, and suppress the light extracting efficiency from decreasing, while suppressing the color unevenness caused by the difference in emission intensity distribution between the semiconductor light emitting element and the fluorescent material layer. As a result, the light emitting device that emits bright light with less color unevenness can be achieved.

DETAILED DESCRIPTION OF THE INVENTION

Figure 1:
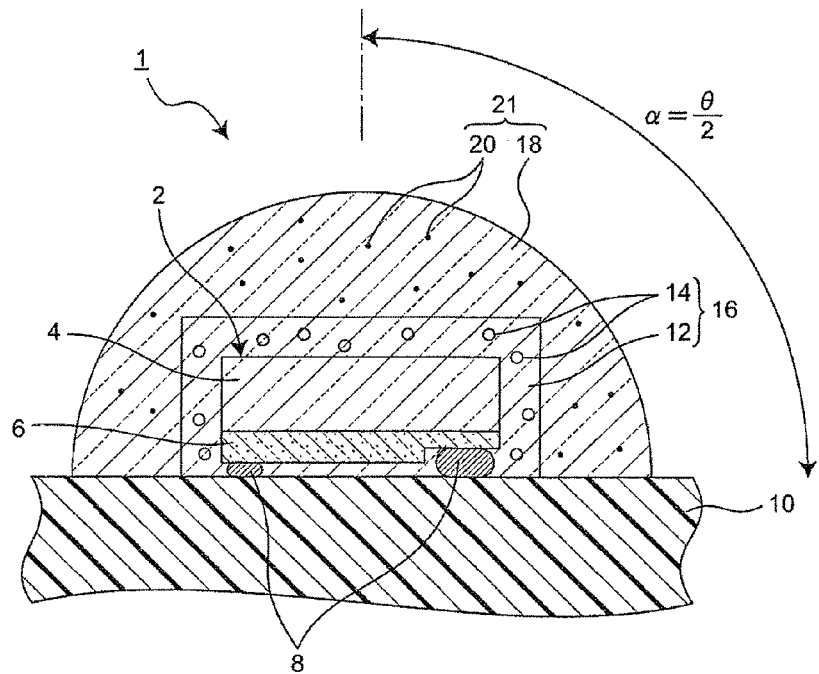
FIG. 1 is a schematic sectional view showing a light emitting device according to the first embodiment of the present invention.

Preferred embodiments of the present invention will be described below with reference to the accompanying drawings. The drawings show the objects schematically, and information included therein such as layout, dimensions, proportion and shape may be different from the actual. The members using the same reference numeral as that of another embodiment in the respective embodiments denote the same or corresponding members, and description thereof may be omitted.

In the present specification, the term "refractive index" means the value of refractive index observed for the wavelength of the primary light emitted by the semiconductor light emitting element. The description that a material is transparent means that the material has sufficiently transparency to the primary light of the semiconductor light emitting element and the secondary light of the fluorescent material layer, and the mixed light of the primary light of the semiconductor light emitting element and the secondary light of the fluorescent material layer can pass therethrough and function as the light source. "Mixing" of light means mixing of light having different values of chromaticity in space so that the resultant light is perceived by the human eye as light having chromaticity different from that of each original light.

In the present specification, terms "up" and "down" are used also to indicate the side of the light emitting device where emitted light is extracted and the opposite side, respectively. For example, "upward" indicates the direction of the light emitting device where emitted light is extracted, and "downward" indicates the opposite direction. Also, "Top surface" indicates the surface one the side of the light emitting device where light is extracted, and "bottom surface" indicates the surface on the opposite side. Terms "side face" and "sideways" indicate the surface or direction perpendicular to the above "top surface" and the "bottom surface." Term "inside" used in relation to the light emitting device means a position nearer to the light emitting layer of the light emitting device and "outside" means a position on the opposite side.

First Embodiment

Figure 2:
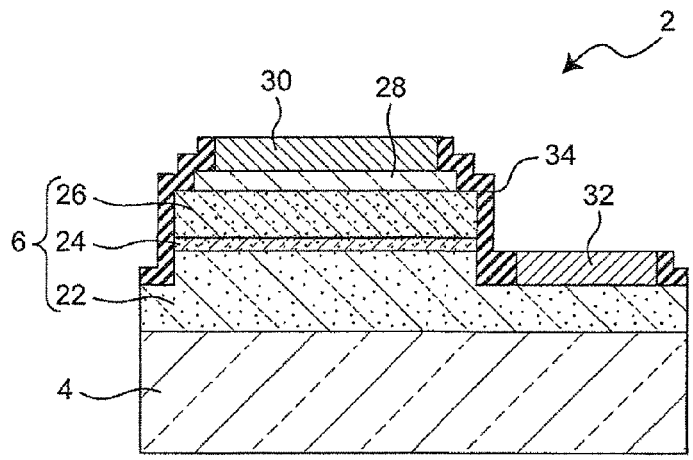
FIG. 2 is a schematic sectional view showing an example of a light emitting element used in the light emitting device of FIG. 1.

FIG. 1 is a schematic sectional view showing a light emitting device 1 according to the first embodiment of the present invention. A semiconductor light emitting element 2 is fastened via a solder bump 8 on a mounting substrate 10, and the periphery is coated by a fluorescent material layer 16 having substantially uniform thickness. The semiconductor light emitting element 2 is constituted by forming a semiconductor layer 6, that has a light emitting layer capable of emitting blue light, on a substrate 4 of square shape in plan view, and is flip-chip mounted with the semiconductor layer 6 facing down and the substrate 4 facing up. The fluorescent material layer 16 is formed by dispersing fluorescent material particles 14 in a transparent fluorescent material holding member 12, so that the fluorescent material particles 14 absorb a part of blue light (primary light) emitted by the semiconductor light emitting element 2 and emit light of longer wavelength such as yellow light (secondary light). Formed on the light emitting side of the fluorescent material layer 16 is a scattering layer 21 that coats the semiconductor light emitting element 2 and the fluorescent material layer 16 as a whole. FIG. 2 is a schematic sectional view showing the structure of the semiconductor light emitting element 2, constituted by sequentially laminating an n-side semiconductor layer 22, a light emitting layer 24 and a p-side semiconductor layer 26 successively on the substrate 4 such as sapphire that has transparent and insulating properties. The p-side semiconductor layer 26 and the active layer 24 are partially removed to expose the n-side semiconductor layer 22, and an n-side electrode 32 is formed on the exposed surface. A reflective electrode 28 is formed over substantially the entire surface of the p-side semiconductor layer 26, and also a p-side electrode 30 for connection to the outside is formed. Film 34 is an insulating protective film.

With the light emitting device 1 having such a constitution, emission of light having desirable chromaticity can be obtained by color mixing the primary light emitted by the semiconductor light emitting element 2 and the secondary light having a longer wavelength emitted by the fluorescent material layer 16. When the fluorescent material layer 16 emits yellow light, for example, it is blended with the blue light emitted by the semiconductor light emitting element 2 thereby to obtain white light. In the light emitting device 1 of the present embodiment, since the top surface and four side faces of the semiconductor light emitting element 2 mounted on the mounting substrate 10 are coated by the transparent material without blocking the light, surfaces of the light emitting device that oppose the top surface and four side faces of the semiconductor light emitting element 2 all serve as light extracting surfaces, thus enabling it to extract light with high efficiency. Particularly in the present embodiment, the semiconductor light emitting element 2 is coated by the scattering layer 21 of semi-spherical dome shape. As a result, when the semiconductor light emitting element 2 is regarded as a point light source, light emits perpendicularly to the surface of the scattering layer 21 in every direction, so that reflection loss at the surface of the scattering layer 21 is reduced and light extracting efficiency increases. However, when there is a difference between the emission intensity distribution exhibited by the semiconductor light emitting element 2 and the emission intensity distribution exhibited by the fluorescent material layer 16, color unevenness occurs as the chromaticity changes with the position within the light emitting device 1 and with the direction of viewing the light emitting device 1. When light is extracted over a range of 180 degrees around the optical axis of the semiconductor light emitting element 2 as shown in FIG. 1, in particular, color unevenness due to the difference in light distribution characteristic between the semiconductor light emitting element 2 and the fluorescent material layer 2 becomes conspicuous since light is emitted not only through the top of the semiconductor light emitting element 2 but also through the side faces thereof.

As shown in FIG. 1, the fluorescent material layer 16 is formed to coat the top surface and four side faces of the semiconductor light emitting element 2 with substantially uniform thickness, thereby to emit the secondary light of longer wavelength in every direction from the fluorescent material particles 14 provided in the fluorescent material layer 16. Therefore, difference in intensity is relatively small between the secondary light emitted upward from the fluorescent material layer 16 and the secondary light emitted sideways. Also the fluorescent material layer 16 is uniform regardless of the position therein because its structure does not change with the position in the surface, and therefore shows an emission intensity distribution that is relatively uniform. In contrast, the semiconductor light emitting element 2 emits the primary light by surface emission from the thin light emitting layer 24 included in the semiconductor layer 6. As a result, the light distribution characteristic of the primary light has such a characteristic distribution that is high upward and horizontal directions and is low in oblique directions. Since the semiconductor light emitting element 2 also has a complicated electrode structure as shown in FIG. 2, a current density distribution tends to generate in the light emitting layer 24 and an influence is exerted by the blocking and absorption of light by the electrodes 30, 32. Accordingly, the primary light emitted by the semiconductor light emitting element 2 has strong in-surface distribution of emission. As a result, there is difference between the emission intensity distribution of the fluorescent material layer 16 and the emission intensity distribution of the semiconductor light emitting element 2, thus resulting in color unevenness.

In the present embodiment, light returning from the fluorescent material layer 16 can be reduced to achieve light emission of high efficiency, by slightly coating the periphery of the semiconductor light emitting element 2 with the fluorescent material layer 16 having substantially uniform thickness. As a result, the difference between the emission intensity distribution of the fluorescent material layer 16 and the emission intensity distribution of the semiconductor light emitting element 2 tends to increase, thus aggravating the problem of color unevenness. That is, when the periphery the semiconductor light emitting element 2 is coated with the fluorescent material layer 16 having substantially uniform thickness, the fluorescent material layer 16 has one flat light emitting surface substantially parallel to the principal surface of the semiconductor light emitting element 2 on the light emitting side thereof, and four flat light emitting surfaces substantially parallel to the side faces of the semiconductor light emitting element 2. Since the fluorescent material layer 16 has uniform intralayer structure as described above, intensity of the secondary light emitted by the fluorescent material layer 16 depends on the length of the optical path of the primary light passing through the fluorescent material layer 16. When the fluorescent material layer 16 has the flat light emitting surfaces nearly parallel to the principal surface of the semiconductor light emitting element 2 on the light emitting side thereof, and the flat light emitting surfaces nearly parallel to the side faces of the semiconductor light emitting element 2 as in the present embodiment, although the optical path length passed through the fluorescent material layer 16 by the primary light emitting at right angles from each surface of the semiconductor light emitting element 2 agrees with the thickness of the fluorescent material layer 16, the optical path length passed through the fluorescent material layer 16 by the primary light emitting obliquely from each surface of the semiconductor light emitting element 2 is longer than the thickness of the fluorescent material layer 16. As a result, emission intensity distribution of the secondary light emitted by the fluorescent material layer 16 shows higher intensity in the direction oblique to surface of the semiconductor light emitting element 2 than in the direction perpendicular to the surface of the semiconductor light emitting element 2. However, the situation is commonly opposite for the emission intensity distribution of the primary light emitted by the semiconductor light emitting element 2. Namely, emission intensity is lower in the direction oblique to each surface of the semiconductor light emitting element 2 than in the direction perpendicular to each surface of the semiconductor light emitting element 2. As a result, the difference between the emission intensity distribution of the fluorescent material layer 16 and the emission intensity distribution of the semiconductor light emitting element 2 becomes more conspicuous and color unevenness tends to be more significant.

Accordingly, the light emitting device 1 of the present embodiment is characterized in that the primary light emitted by the semiconductor light emitting element 2 is caused to emit to the outside after being selectively scattered by the scattering layer 21 formed around the semiconductor light emitting element 2. Selective scattering of the primary light of the semiconductor light emitting element 2 makes the emission intensity distribution of the semiconductor light emitting element more uniform. As a result, the difference in the emission intensity distribution between the semiconductor light emitting element 2 and the fluorescent material layer 16 can be decreased so as to suppress color unevenness. Also because the secondary light emitted by the fluorescent material layer 16 is not strongly scattered by the scattering layer 21, the light that returns to the semiconductor light emitting element 2 and the fluorescent material layer 16 due to excessive scattering of the secondary light can be decreased, and light extracting efficiency can also be suppressed from decreasing. As a result, the light emitting device that emits bright light with less color unevenness by simultaneously improving the color unevenness and the light extracting efficiency can be achieved.

The effect of improving the color unevenness becomes more remarkable when the angle of light emission of the light emitting device 1 around the semiconductor light emitting element 2 increases, as in the present embodiment. The light emission angle θ of the light emitting device 1 refers to the angular range, with the semiconductor light emitting element located at the vertex of the angle, in which light emits from the light emitting device, and θ becomes 2α when light emits over an angular range defined by angle α from the optical axis of the light emitting device 1. In the case of the present embodiment, θ=180 degrees. Since the light emitting layer 38 of the semiconductor light emitting element 2 is a thin layer, as described above, the light distribution characteristic of light emitted from the semiconductor light emitting device 2 has such a characteristic distribution that is high in upward and horizontal directions and is low in oblique directions. Therefore, when the light emitting device has a wide light emission angle, color unevenness due to the light distribution characteristic of the semiconductor light emitting element 2 is likely to appear. On the other hand, if color unevenness can be suppressed, it is more advantageous for a light source, in many cases, that the light emitting device has a wider angular range of emission. In the present embodiment, since the light distribution characteristic of the semiconductor light emitting element 2 can be improved by means of the scattering layer 21, color unevenness can be suppressed even when the light emission angle of the light emitting device 1 is increased. According to the present invention, the light emission angle of the light emitting device 1, with the semiconductor light emitting element 2 located at the vertex of the angle, is 120° or more, preferably 150° or more, and most preferably 180° or more.

The scattering layer 21 is constituted by dispersing the particles 20 in the transparent medium 18 made of a transparent resin or glass. By dispersing the particles 20 having a mean particle size D that satisfies Inequality 1, it is made possible to selectively scatter only the primary light emitted by the semiconductor light emitting element 2. In Inequality 1 shown below, λ is a wavelength that the primary light emitted by the semiconductor light emitting element 2 shows when it propagates in the transparent medium 18.

$$20 \text{ nm} < D \leq 0.4 \times \lambda/\pi \quad \text{[Inequality 1]}$$

Regarding scattering theory, the particles 20 scatter light in different modes depending on the value of size parameter $\alpha = \pi D/\lambda$: Rayleigh scattering when $\alpha \leq 0.4$, Mie scattering when $0.4 < \alpha < 3$ and diffractive scattering when α is 3 or more. Therefore, the primary light emitted by the semiconductor light emitting element 2 undergoes Rayleigh scattering when a particle size D of the particles 20 is $(0.4 \times \lambda/\pi)$ or less. For example, when the refractive index of the transparent medium 18 is from 1.4 to 1.5, blue light having a wavelength of 450 nm in air undergoes Rayleigh scattering regime when the particle size D is about 40 nm or less.

In the Rayleigh scattering regime, scattering coefficient ks is given by the following equation.

$$k_s = \frac{2\pi^6}{3} n \left(\frac{m^2 - 1}{m^2 + 2}\right)^2 \frac{D^5}{\lambda^4} \quad \text{[Equation 2]}$$

n in the above formula is the number of particles 20 per 1 cm$^3$, m is a reflection coefficient, D is a particle size of the particle 20 and λ is a wavelength of light in the medium 18 in which the particles 20 are dispersed. As shown by this formula, since scattering intensity in the Rayleigh scattering regime is inversely proportional to the fourth power of the wavelength λ of the light, light of smaller wavelength is scattered more strongly. Therefore, the primary light having shorter wavelength emitted by the semiconductor light emitting element 2 is scattered more strongly than the secondary light of longer wavelength emitted by the fluorescent material layer 16.

Figure 3:
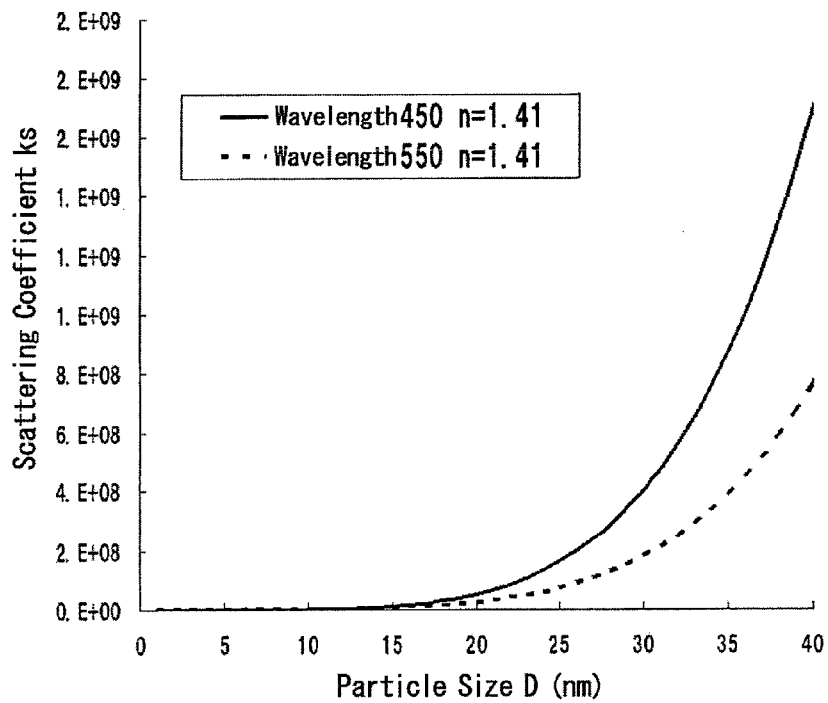
FIG. 3 is a graph showing a relation between the particle size D of particles and the scattering coefficient ks.

FIG. 3 is a graph showing a relation between the particle size D and the scattering coefficient ks for light having a wavelength of 450 nm and 550 nm when the number n of the particles 20 is 8,500,000,000, the refractive index of the particles 20 is 2.15 and the refractive index of the transparent medium 18 is 1.41. As shown in FIG. 2, light having a wavelength of 450 nm is scattered twice or more strongly as light having a wavelength of 550 nm, when the particle size D of the particles is 40 nm or less, namely falls within the Rayleigh scattering regime. However, the scattering coefficient ks decreases as the particle size D becomes smaller and, when the particle size D of the particles 20 is 20 nm or less, intensity of scattering decreases for the light of either wavelength. Accordingly in the present embodiment, the mean particle size D of the particles 20 is set 20 nm or more. When the mean particle size of the particles is 20 nm or more, a desired level of scattering intensity for the primary light in the visible range can be obtained by appropriately controlling the number of particles. When the mean size of the particles is 20 nm or less, a desired level of scattering intensity cannot be obtained unless a significantly larger number of particles are provided, while too large number of particles make it difficult to disperse them in the resin. Thus the primary light of the semiconductor light emitting element 2 can be scattered selectively over the secondary light of longer wavelength emitted by the fluorescent material layer 16, when the particle size D of the particles 20 is set more than 20 nm and $(0.4 \times \lambda/\pi)$ nm or less.

In the light emitting device 1 shown in FIG. 1, an inorganic material having a higher refractive index than that of the transparent medium 18 is used as the particles 20 in the scattering layer 21. For example, a silicone resin or epoxy resin having a refractive index in a range from 1.41 to 1.53 may be used for the transparent medium 18, and zirconia having a refractive index of 2.15 may be used for the particles. This increases the effective refractive index of the scattering layer 21 and improves the light extracting efficiency of the light emitting device 1. In the light emitting device 1 shown in FIG. 1, the semiconductor light emitting element 2 is flip-chip mounted with the substrate 4 facing up, and therefore light emitting from the substrate 4 is extracted outside through the interface between the substrate 4 and the fluorescent material layer 16 and the interface between the fluorescent material layer 16 and the scattering layer 21. Light entering from a medium having a higher refractive index into a medium having a lower refractive index undergoes total reflection at an interface when the incident angle is larger than the critical angle that is determined by the difference in refractive index. Therefore, in order to efficiently extract the primary light emitted by the semiconductor light emitting element 2 to the outside of the light emitting device 1, it is preferable that the refractive indices of the scattering layer 21 and the fluorescent material layer 16 are as proximate to the refractive index of the substrate 4 as possible. Refractive index of a material used in the substrate 4 of the semiconductor light emitting element 2 is usually about from 1.7 to 2.5 (about 1.76 in the case of sapphire). Refractive index of the scattering layer 21 can be increased from the level of 1.41 to 1.53 of the transparent medium 18 to a level proximate to the refractive index of the substrate 4, by dispersing the particles 20 having a high refractive index in the transparent medium 18. Difference in effective refractive index between the scattering layer 21 and the substrate 4 is preferably 0.2 or less, and more preferably 0.05 or less. When the scattering layer 21 and the substrate 4 have refractive indices proximate to each other, difference in effective refractive index at each interface can be decreased so as to decrease the reflection loss, by setting the refractive index of the fluorescent material layer 16 near to those of the members disposed on both sides thereof. This results in an improvement in the light extracting efficiency of the light emitting device 1. In the case of face-up mounting where the substrate 4 is disposed at the bottom, too, it is preferable that the refractive indices are set similarly. When the substrate of the semiconductor light emitting element is removed to have only the semiconductor layer remain, it is preferable that difference in effective refractive index between the semiconductor layer that constitutes the semiconductor light emitting element and the scattering layer 21 is 0.2 or less, and more preferably 0.05 or less. In order to utilize the light emitting from the side face of the semiconductor light emitting element, it is preferable to use the semiconductor light emitting element that has a transparent substrate as in the light emitting device shown in FIG. 1.

The respective members constituting the light emitting device 10 of the present embodiment will be described in detail below.

Scattering Layer 21

The scattering layer 21 is formed by dispersing the particles 20 in the transparent medium 18. When the light emitting device emits light at a large emitting angle as in the present embodiment, it is preferable to coat the periphery of the semiconductor light emitting element 2 and the fluorescent material layer 16 with the scattering layer 21 over a wide range of angles. The scattering layer 21 is disposed in a region through which light propagating within the light emitting angle of the light emitting device 1 passes, by taking into consideration the light path followed by the primary light emitted by the semiconductor light emitting element 2 that is not subjected to scattering. This region is preferably coated entirely by the scattering layer 21. In the present embodiment, the scattering layer 21 is formed in a semi-spherical shape so as to entirely coat the semiconductor light emitting element 2 and the fluorescent material layer 16. When the scattering layer 21 has a semi-spherical shape, reflection loss at the interface between the scattering layer 21 and the outside (air) decreases, which is preferable. The scattering layer 21 may be disposed anywhere as long as it can scatter the primary light emitted by the semiconductor light emitting element 2. Provided that, in order to improve the emission intensity distribution of the semiconductor light emitting element 2, it is preferable that the semiconductor light emitting element 2 having square shape is positioned at the center of the scattering layer 21 in plan view. It is also preferable that the scattering layer 21 coats the top surface and the side faces of the semiconductor light emitting element 2 in sectional view. The scattering layer 21 is disposed on the light emitting side of the fluorescent material layer 16. The light emitting side of the fluorescent material layer 16 refers to the side of the principal surface opposite to the surface that receives the primary light emitted by the semiconductor light emitting element 1, among the two principal surfaces of the fluorescent material layer 16. By disposing the scattering layer 21 on the light emitting side of the fluorescent material layer 16, it is made possible to improve the emission intensity distribution of the primary light that has passed the fluorescent material layer 16 and it becomes easier to suppress the color unevenness in the final output. On the other hand, since the scattering layer 21 does not strongly scatter the secondary light of the fluorescent material layer 16, the light that returns due to excessive scattering of the secondary light can also be suppressed from increasing. It is preferable to coat the entire principal surface on the light emitting side of the fluorescent material layer 16 with the scattering layer 21.

(a) Particles 20

The particles 20 can scatter the light if it is formed from a material having a refractive index different from that of the transparent medium 18 wherein the particles are dispersed, but the material preferably has a refractive index higher than that of the transparent medium 18. This enables it to further increase the light extracting efficiency of the light emitting device 1 and improve reliability. That is, it is made possible to increase the effective refractive index of the scattering layer 21 and improve the light extracting efficiency when the particles 20 have a high refractive index. This widens a selection range of the material of the transparent medium 18, and makes it possible to use a material having higher durability for the transparent medium 18.

It is also possible to use, as particles 20, various materials such as inorganic materials, organic materials and composite materials. It is preferred that particles 20 are formed from the inorganic material since durability, heat conductivity and refractive index of the particles 20 itself are enhanced. If heat conductivity of the particles 20 becomes higher, efficiency of heat dissipation through the scattering layer 21 is also improved.

It is preferred to use, as the material of the particles 20, inorganic materials having a high refractive index (particularly, oxide, nitride, sulfide). Examples thereof include titanium oxide, niobium oxide, aluminum oxide, yttrium oxide, zirconium oxide, diamond, tantalum oxide, cerium oxide, yttrium aluminum garnet (YAG), yttrium vanadate ($YVO_4$), indium oxide, zinc sulfide and silicon nitride. Of these materials, zirconium oxide and niobium oxide are preferably used. It is preferred to use, as the material of the articles 20, materials different form the fluorescent material.

It is desirable that refractive index of the particles 20 is 1.7 or more, and more preferably 2.0 or more. This is because, the more the refractive index of the particles 20 than that of the transparent medium 18, the more strongly the primary light is scattered by the particles 20 and the effective refractive index of the scattering layer 21 increases. A level of refractive index of the particles 20 used commonly would not be regarded as being too large. As refractive index of the particles 20 increases, difference thereof from that of the transparent medium 18 increases and strength of scattering increases. When the strength of scattering is too large, it can be controlled within a proper range by adjusting the number of particles 20. Such a level of refractive index is desirable particularly when peak wavelength of the primary light emitted by the semiconductor light emitting element is from 420 to 500 nm.

It is necessary that mean particle size D of the particles 20 satisfy Inequality 1. However, it is preferable that mean particle size D is larger within the range of Inequality 1, in order to increase the strength of scattering the primary light emitted by the semiconductor light emitting element. The mean particle size D is preferably 25 nm or more, and more preferably 30 nm or more. When the particle size of the particle 20 is not spherical, the particle size is determined in terms of a maximum size of the particle 20.

The amount (% by weight) of the particles 20 to be dispersed in the transparent medium 18 is 10% or more, preferably 50% or more. This is because the strength of scattering light by the particles 20 depends also on the number of particles 20 as implied by Equation 2. Heat conductivity of the scattering layer 21 is improved as the amount of the particles 20 to be dispersed increases. When the amount of particles 20 to be dispersed is too large, light returning from the scattering layer 21 to the semiconductor light emitting element 2 and the fluorescent material layer 16 increases, and the light extracting efficiency decreases. Thus amount of the particles 20 to be dispersed is preferably 80% or less, and more preferably 70% or less.

The object of the scattering layer 21 of this embodiment is to scatter the primary light of the semiconductor light emitting element 2 and let it emit to the outside, and therefore it is important to prevent the primary light of the semiconductor light emitting element 2 that returns back from increasing and causing the utilization rate of the semiconductor light emitting element 2 to decrease. For this purpose, it is preferable to control the number, particle size, refractive index or the like of the particles 20 dispersed in the scattering layer 21 so that 80% or more, more preferably 90% or more of the primary light emitted by the semiconductor light emitting element 2 can emit to the outside of the light emitting device 1.

There is no restriction on the distribution of the particles 20 in the scattering layer 21. It is advantageous to have such a distribution as the density decreases from the semiconductor light emitting element 2 toward the side where the light is extracted (air side), as this provides a high effective refractive index on the side of the semiconductor light emitting element 2 (refractive index of 1.76) and a lower effective refractive index on the side that is in contact with the outside air (refractive index 1).

(b) Transparent Medium 18

It is preferable that the transparent medium 18 is colorless and has high transmittance, homogeneity, high isotropy and high durability. However, there is a limitation on the material that satisfies these optical properties, and the refractive index is in a range from about 1.4 to 1.54. These values are lower than those of sapphire and group III-V semiconductors that are commonly used in semiconductor light emitting elements for emitting visible light of short wavelengths. Therefore, an interface with a large difference in a refractive index exists in the path of light propagating from the semiconductor light emitting element through the transparent resin to the outside of the light emitting device, and extraction of light is impeded by total reflection taking place at the interface. This also decreases the light extracting efficiency of the light emitting device. In the present embodiment, it is possible to increase light extracting efficiency by increasing a refractive index of the transparent medium 18, since the particles 20 having high refractive index are dispersed in the transparent medium 18.

It is possible to use, as the material of the transparent medium 18, organic materials and inorganic materials that have transparency to light of the semiconductor light emitting element 2. As the organic material, resins having transparency can be used. It is preferred to use a silicone resin composition and a modified silicone resin composition. It is also possible to use insulating resin compositions having transparency, such as an epoxy resin composition, a modified epoxy resin composition and an acrylic resin composition. It is also possible to utilize resins having excellent weatherability, such as a hybrid resin containing at least one kind of these resins. It is possible to use, as the inorganic material, amorphous materials such as glass, inorganic crystals and ceramics. It is preferred to use, as the material of the transparent medium 18, a silicone resin composition and a modified silicone resin composition. It is preferred to use insulating resin compositions having transparency, such as an epoxy resin composition, a modified epoxy resin composition and an acrylic resin composition since the insulating resin compositions are colorless and transparent even after curing and have excellent properties of an optical material, such as homogeneity and high isotropy, and also inexpensive and are easily molded. Although these materials have a low refractive index of about 1.4 to 1.54, it is possible to increase an effective refractive index by dispersing particles having a high refractive index.

It is possible to enhance reliability of the light emitting device by using, as the material of the transparent medium 18, a silicone resin composition having no phenyl group introduced thereinto, a modified silicone resin composition having no phenyl group, for example, a methyl-based silicone resin composition or a methyl-based modified silicone resin composition by the following reason. When the phenyl group is introduced, the refractive index of the transparent medium 18 increases, while light resistance and heat resistance of the transparent medium 18 deteriorate. It is possible to increase the effective refractive index of the scattering layer 21 by dispersing particles 20 having a high refractive index without introducing the phenyl group into the transparent medium 18.

It is possible to increase the refractive index of the transparent medium 18 by using, as the material of the transparent medium 18, a silicone resin composition having a phenyl group introduced thereinto or a modified silicone resin composition having a phenyl group introduced thereinto. It is possible to further increase the effective refractive index of the scattering layer 21 and to improve light extracting efficiency of the light emitting device 1 by dispersing particles 20 having a high refractive index.

The effective refractive index of the scattering layer 21 can be estimated from the relative dielectric constant of the transparent medium 18 and the relative dielectric constant of the particles 20, on the basis of Maxwell-Garnet theory. It is also important that the transparent medium 18 and the particles 20 are transparent to the primary light of the semiconductor light emitting element 2. However, these members may be formed from materials that absorb ultraviolet rays beyond the visible region, since the primary light of the semiconductor light emitting element 2 is visible light.

Fluorescent Later 16

When the light emitting device has a large emission angle as in the present embodiment, it is preferable to coat the periphery of the semiconductor light emitting element 2 with the fluorescent material layer 16 over a wide range of angles. It is also preferable to coat the entire region through which light propagating within the light emitting angle of the periphery the light emitting device 1 passes, by taking into consideration the light path followed by the primary light emitted by the semiconductor light emitting element 2 in case it is not scattered. The fluorescent material layer 16 may be provided in various forms. For example, the fluorescent material layer may be formed by having fluorescent material particles of inorganic material included in a fluorescent material holding member formed from a transparent resin. The fluorescent material layer 16 can be formed around the semiconductor light emitting element 2 by various processes such as potting, screen printing or the like. There is no limitation on the fluorescent material layer 16 as long as it is capable of absorbing a part of light emitted by the semiconductor light emitting element 2 and emitting light of a longer wavelength. The fluorescent material layer 16 may be formed by having fluorescent material particles 14 contained in the fluorescent material holding member 12 such as glass or resin as in the present embodiment, or formed from a fluorescent material in crystal or an amorphous material.

It is preferable to use, as the fluorescent material particles 14, a fluorescent material that is excited by blue light and emits yellow light of broad spectrum, since white light having high color rendering performance is obtained. It is particularly preferable to use fluorescent material particles 14 formed from an inorganic material, because an inorganic material can endure intense heat or light produced by the semiconductor light emitting element 2. Wavelength of peak emission of the fluorescent material preferably is from 500 to 600 nm, more preferably from 520 to 560 nm. The fluorescent material particles 14 may be formed from, for example, a fluorescent material having garnet structure activated with cerium (particularly a fluorescent material having garnet structure that is activated with cerium and contains aluminum). A fluorescent material activated with cerium has broad emission spectrum in yellow region, and is therefore capable of producing white light of high color rendering performance when combined with blue light emission. A fluorescent material having garnet structure, particularly garnet structure containing aluminum, is durable against heat, light and moisture and can maintain the emission of yellow light with high brightness over a long period of time. As the wavelength converting material, for example, it is preferable to use a YAG fluorescent material (usually abbreviated to YAG) having composition of $(Re_{1-x}Sm_x)_3(Al_{1-y}Ga_y)_5O_{12}:Ce$ ($0 \leq x \leq 1$, $0 \leq y \leq 1$, where Re is at least one element selected from the group consisting of Y, Gd, La, Lu and Tb). Color rendering performance may also be adjusted by using a fluorescent material such as $Lu_3Al_5O_{12}:Ce$, $BaMgAl_{10}O_{17}:Eu$, $BaMgAl_{10}O_{17}:Eu, Mn$, $(Zn, Cd)Zn: Cu$, $(Sr, Ca)_{10}(PO_4)_6Cl_2:Eu, Mn$, $(Sr, Ca)_2Si_5N_8:Eu$, $CaAlSiB_xN_{3+x}:Eu$, and $CaAlSiN_3:Eu$, other than the yellow fluorescent material.

It is possible to use, as the material of the fluorescent material holding member 12 containing fluorescent material particles 14, organic materials and inorganic material that have transparency to light of the semiconductor light emitting element 2. As the organic material, a resin having a transparency is preferred. For example, it is preferred to use a silicone resin composition and a modified silicone resin composition. However, it is possible to use insulating resin compositions having transparency, such as an epoxy resin composition, a modified epoxy resin composition and an acrylic resin composition. It is also possible to utilize resins having excellent weatherability, such as a hybrid resin containing at least one kind of these resins. It is also possible to use, as the inorganic material, amorphous materials such as glass, inorganic crystals and ceramics. As described above, when the crystal of the fluorescent material or amorphous material itself is used as the material of the fluorescent material layer 16, a fluorescent material holding member 12 becomes unnecessary.

Semiconductor Light Emitting Element 2

The semiconductor light emitting element 2 may be one that is provided with a light emitting layer formed from a semiconductor. Particularly a light emitting element having a light emitting layer formed from a nitride semiconductor, and a light emitting layer formed from a nitride gallium compound semiconductor (particularly InGaN) above all, can emit intense light in blue region, and therefore can be advantageously combined with the fluorescent material layer 16. While it is sufficient that the light emitting layer 24 of the semiconductor light emitting element 2 emits light with peak wavelength in the visible region, it is desirable that the peak wavelength is from 420 nm to 500 nm, more preferably from 445 nm to 465 nm. When the semiconductor light emitting element 2 emits blue light in this wavelength region, it can emit light of desired color, particularly white light, by combining it with various kinds of fluorescent material layer 16. The semiconductor light emitting element 2 may also have a light emitting layer formed from a ZnSe-based, InGeAs-based or AlInGaP-based semiconductor. The semiconductor light emitting element 2 is preferably a light emitting diode of surface emission type, where light is extracted from the bottom surface of the substrate 4 or the top surface of the semiconductor layer 6.

In the present embodiment, the light emitting element 2 is flip-chip mounted on the mounting substrate 10 with the substrate 4 facing up, as shown in FIG. 1. The mounting substrate 10 has electrodes (not shown) formed on the top surface thereof, which are connected to the p-side electrode 30 and the n-side electrode 32 of the semiconductor light emitting element 2 via the solder bumps 8.

The semiconductor light emitting element 2 that can be used in the present invention is not limited to one that has the structure shown in FIG. 2. For example, insulating, semi-insulating or reverse conductivity type structure may be provided in a part of the layer of each conductivity type. The substrate 4 may also be electrically conductive, in which case the n-side electrode 32 may be formed on the back surface of the substrate 4. The substrate 4 may be either the substrate used to grow the semiconductor layer 6 or may be attached after growing the semiconductor layer 6. The substrate 4 may be removed. For example, after the light emitting element 2 including the substrate 4 has been flip-chip mounted, the substrate 4 may be peeled.

Mounting Substrate 10

The mounting substrate 10 may have wiring formed on the surface thereof for electrical connection with the semiconductor light emitting element 2. In the present embodiment, the mounting substrate 10 is made by forming the wiring on a flat insulating member. It is possible to use, as the insulating member, ceramics such as aluminum nitride or alumina, or glass. The mounting substrate 10 may also be used by forming an insulating thin film such as aluminum nitride on the surface of semi-metal such as Si or a metal. The mounting substrate 10 having such a constitution is preferable because of high heat dissipation. The wiring may be formed by subjecting a metal layer to patterning using an ion milling method or an etching method. For example, the wiring pattern may be formed from a thin film of platinum or the like on the surface of aluminum nitride. In addition, a protective film may also be formed from a thin film such as $SiO_2$ for the purpose of protecting the wiring.

Second Embodiment

Figure 4:
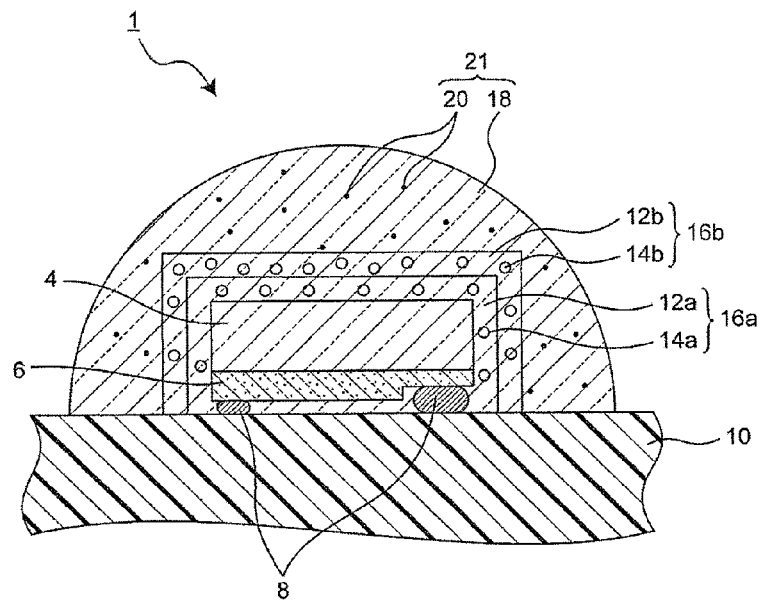
FIG. 4 is a schematic sectional view showing a light emitting device according to the second embodiment of the present invention.

FIG. 4 is a sectional view showing a light emitting device according to the second embodiment of the present invention. The light emitting device 1 shown in FIG. 4 comprises two layers; a first fluorescent material layer 16a that emits red light and a second fluorescent material layer 16b that emits yellow light, disposed in this order from the inside. Fluorescent material layer 16a is formed by dispersing fluorescent material particles 14a in a fluorescent material holding member 12a, and fluorescent material layer 16b is formed by dispersing fluorescent material particles 14b in a fluorescent material holding member 12b. This constitution enables it to make the light emitting device that emits light with higher red component and higher mean color rendering index Ra than in the case of forming only the fluorescent material layer 16 that emits yellow light. The light emitting device having higher mean color rendering index Ra is suited for illumination applications. Increasing the red component also enables it to make the light emitting device that emits light of warm white. This embodiment is similar to the first embodiment in other respects.

The first fluorescent material layer 16a preferably contains fluorescent material particles 14a that emit light in yellow to red color range. Fluorescent materials that transform visible light into light in yellow to red color range include a nitride fluorescent material, an oxynitride fluorescent material and a silicate fluorescent material.

Examples of nitride fluorescent material and oxynitride fluorescent material include Sr—Ca—Si—N:Eu, Ca—Si—N:Eu, Sr—Si—N:Eu, Sr—Ca—Si—O—N:Eu, Ca—Si—O—N:Eu, Sr—Si—O—N:Eu, etc. Of the nitride fluorescent material and the oxynitride fluorescent material, an alkaline earth-silicon nitride fluorescent material is preferred and is represented by the following formula: $LSi_2O_2N_2$:Eu, $L_xSi_yN_{(2/3x+4/3y)}$:Eu, $L_xSi_yO_zN_{(2/3x+4/3y-2/3x)}$:Eu (L represents one of Sr, Ca, or Sr and Ca).

As the silicate fluorescent material, $L_2SiO_4$: Eu (L represents an alkaline earth metal), $(Sr_xMae_{1-x})_2SiO_4$:Eu (Mae represents an alkaline earth metal such as Ca or Ba) is preferably used.

As the second fluorescent material layer 16b, fluorescent material particles 14b that are excited by blue light and emit yellow light in broad spectrum are used. As the fluorescent material particles 14b, a material similar to those described in the first embodiment may be used.

In the present embodiment, while a case where the first fluorescent material layer 16a that emits red light and the second fluorescent material layer 16b that emits yellow light are provided has been described, the present invention is not limited to thereto. Any fluorescent materials may be used as long as they are two fluorescent materials with different light emission wavelengths. Use of two kinds of fluorescent material that emit light of different wavelengths improves color rendering performance of the light emitting device. In the present embodiment, a case where two kinds of fluorescent material particles 14a, 14b are held on the different fluorescent material layers 16a, 16b, although two kinds of fluorescent material particles may also be contained in single fluorescent material layer 16. Such a constitution may also be implemented as the primary light emitted by the semiconductor light emitting element 2 excites a first fluorescent material which emits the secondary light for exciting a different kind of fluorescent material to emit light. Use of two kinds of fluorescent material having different chromaticity values makes it possible to emit light with any chromaticity within a region defined by connecting the points of chromaticity of the two kinds of fluorescent material and of the semiconductor light emitting element on the chromaticity diagram.

Third Embodiment

Figure 5:
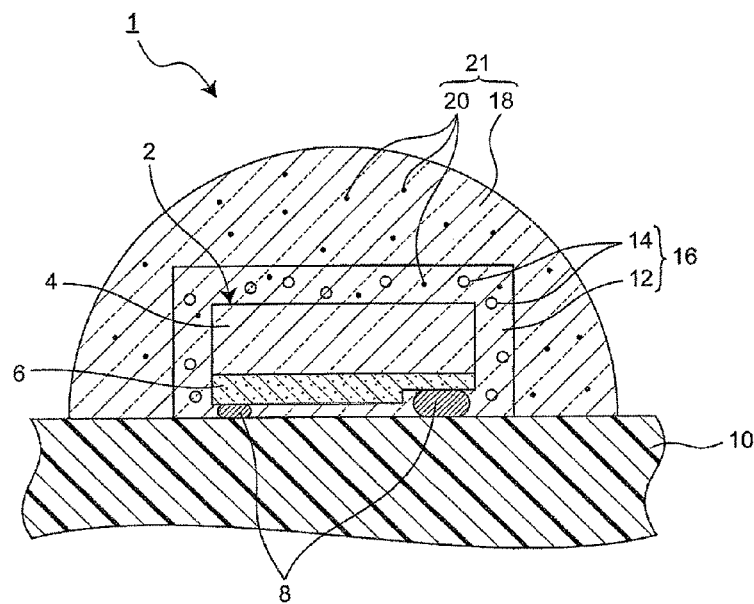
FIG. 5 is a schematic sectional view showing a light emitting device according to the third embodiment of the present invention.

FIG. 5 is a sectional view showing a light emitting device according to the third embodiment of the present invention. The light emitting device 1 shown in FIG. 5 has particles 20 formed from an inorganic material having high refractive index dispersed also in the fluorescent material layer 16. This embodiment is similar to the first embodiment except for this respect.

Refractive index of the fluorescent material layer 16 can be increased by dispersing the particles 20 having a higher refractive index than that of the fluorescent material holding member 12. This increases the critical angle at which total reflection occurs in the interface between the substrate 4 and the fluorescent material layer 16 and the interface between the fluorescent material layer 16 and the scattering layer 21, thereby decreasing the reflection loss at the interfaces. When the particles 20 formed from an inorganic material are dispersed also in the fluorescent material layer 16, the heat conductivity of the fluorescent material layer 16 can be increased and also reliability of the light emitting device is improved. Furthermore, when the particles 20 are also dispersed in the fluorescent material layer 16, emission intensity distribution of the primary light of the semiconductor light emitting element 2 is improved and the proportion of the primary light entering the fluorescent material particles 14 in the fluorescent material layer 16 also increases. Moreover, mean particle size D of the particles 20 dispersed also in the fluorescent material layer 16 satisfies Inequality 1 and the particles do not strongly scatter the secondary light of longer wavelength emitted by the fluorescent material particles 14, and therefore light extracting efficiency can be suppressed from decreasing due to the increase in excessive return light.

In order to disperse the particles 20 in the fluorescent material layer 16 in the present embodiment, the particles 20 may be dispersed along with the fluorescent material particles 14 when forming the fluorescent material layer 16 by potting or printing. When the fluorescent material layer 16 is formed by electrophoresis, a resin containing the particles 20 may be impregnated after forming the fluorescent material layer 16. For example, dipping in the uncured solution of the transparent medium 18 containing the particles 20 may be performed after forming the fluorescent material layer 16. The particles 20 dispersed in the fluorescent material layer 16 may be the same as or different from the particles 20 dispersed in the scattering layer 21, as long as the material satisfies Inequality 1. Provided that it is advantageous to use the same material as the particles 20 dispersed in the scattering layer 21, since it simplifies the process of manufacturing the light emitting device 1. It is preferable that concentration of the particles 20 dispersed in the fluorescent material layer 16 is higher than the concentration of the particles 20 dispersed in the scattering layer 21. Refractive index can be increased by including more particles 20 having high refractive index. Thus it is made possible to extract the primary light and the secondary light efficiently to the outside of the light emitting device 1 by making the refractive index of the scattering layer 21, that is disposed on the light extracting side of the light emitting device 1, lower than the refractive index of the fluorescent material layer 16, since the refractive index of the light emitting device 1 becomes nearer to the refractive index of air with the position from the semiconductor light emitting element 2 toward the light extracting side.

Fourth Embodiment

Figure 6:
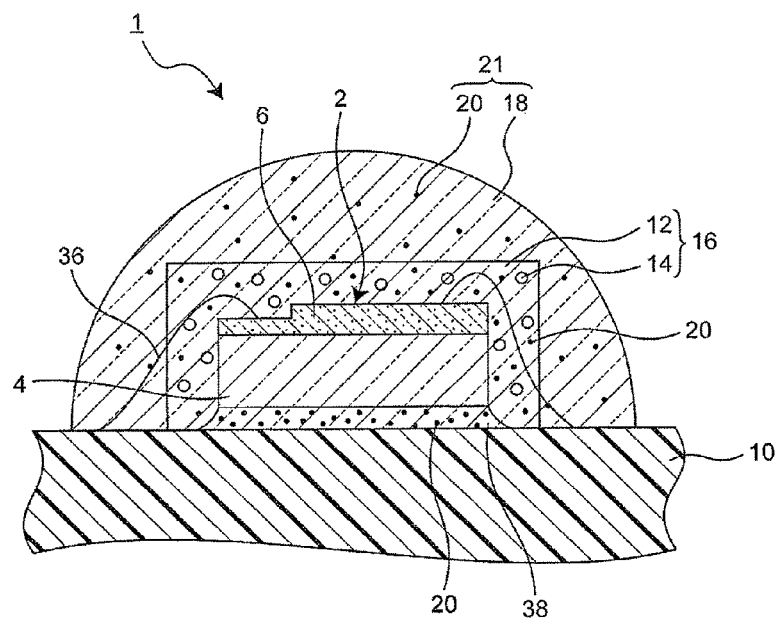
FIG. 6 is a schematic sectional view showing a light emitting device according to the fourth embodiment of the present invention.

FIG. 6 is a schematic sectional view showing a light emitting device according to the fourth embodiment of the present invention. In the present embodiment, the semiconductor light emitting element 2 is mounted with the semiconductor layer 6 facing up, and the particles 20 are dispersed in a die-bonding material 38 that bonds the semiconductor light emitting element 2 onto the mounting substrate 10. This embodiment is similar to the third embodiment in other respects.

The substrate 4 of the semiconductor light emitting element 2 is fastened onto the surface of the mounting substrate 10 by means of the die-bonding material 38, as shown in FIG. 6. The die-bonding material 38 is applied to nearly the entire bottom surface of the semiconductor light emitting element 2. A p-side electrode and an n-side electrode (not shown) formed on the semiconductor layer 6 of the semiconductor light emitting element 2 are connected to the electrodes (not shown) formed on the mounting substrate 10 by wires 36. The die-bonding material 38 that fastens the semiconductor light emitting element 2 onto the mounting substrate 10 contains the particles 20 formed from an inorganic material having a higher refractive index than that of the resin that constitutes the die-bonding material 38 dispersed therein. The periphery of the die-bonding material 38 is coated by the fluorescent material layer 16 and the scattering layer 21.

When the particles 20, formed from an inorganic material having a higher refractive index than that of the resin that constitutes the die-bonding material 38, are dispersed in the die-bonding material 38 that fastens the semiconductor light emitting element 2 onto the mounting substrate 10 as in the present embodiment, refractive index of the die-bonding material 38 becomes proximate to the refractive index of the substrate 4 of the semiconductor light emitting element 2. This decreases the light reflected on the interface between the substrate 4 and the die-bonding material 38, thereby decreasing the light returning into the semiconductor light emitting element 2 and improving the light extracting efficiency. Also as the primary light of the semiconductor light emitting element 2 is scattered in die-bonding material 38, the light arriving at the metal electrode provided on the surface of the mounting substrate 10 decreases and absorption loss therein decreases. Also because the refractive index of the die-bonding material 38 becomes proximate to the refractive index of the substrate 4 and the primary light is scattered by the particles 20 in the die-bonding material 38, such an effect is achieved that would be obtained by providing surface roughness on the back surface of the substrate 4 for the prevention of multiple reflections. As a result, absorption loss due to multiple reflections in the semiconductor light emitting element 2 can be decreased and light extracting efficiency of the light emitting device 1 can be improved. Also as the particles 20 formed from an inorganic material are dispersed in the die-bonding material 38, heat conductivity of the die-bonding material 38 increases and therefore heat dissipation of the light emitting device 1 is improved, resulting in improved reliability. Thickness of the die-bonding material 38 may be, for example, 2 μm or less which is far thinner than the scattering layer 21 and the fluorescent material layer 16. As a result, density of the particles 20 in the die-bonding material 38 can be made higher than those in the scattering layer 21 and the fluorescent material layer 16.

When the semiconductor light emitting element 2 is mounted with the semiconductor layer 6 facing up as in the present embodiment, difference in effective refractive index between the scattering layer 21 and the substrate 4 is preferably 0.2 or less, and more preferably 0.05 or less, similarly to the embodiments described above by the following reason. That is, when the substrate 4 is formed from a transparent material, the substrate 4 having a refractive index proximate to that of the semiconductor layer 6 is selected. When the substrate 4 and the scattering layer 21 have refractive indices that are proximate to each other, difference in effective refractive index at each interface can be decreased so as to decrease the reflection loss, by setting the refractive index of the fluorescent material layer 16 disposed between the substrate 4 and the scattering layer 21 near to those of these members. This results in an improvement in light extracting efficiency of the light emitting device 1. The difference in effective refractive index between the semiconductor layer 6 and the scattering layer 21 can be set to 0.2 or less, and more preferably 0.05 or less, based on the effective refractive index of the semiconductor layer 6.

The particles 20 dispersed in the die-bonding material 38 may be one that satisfies Inequality 1, and may be the same as or different from the particles 20 dispersed in the scattering layer 21 and in the fluorescent material layer 16. While a case of face-up mounting of the semiconductor light emitting element 2 is described in the present embodiment, constitution of the present embodiment may also be applied to the resin filled between the semiconductor light emitting element and the mounting substrate in the case of face-down mounting.

Fifth Embodiment

Figure 7:
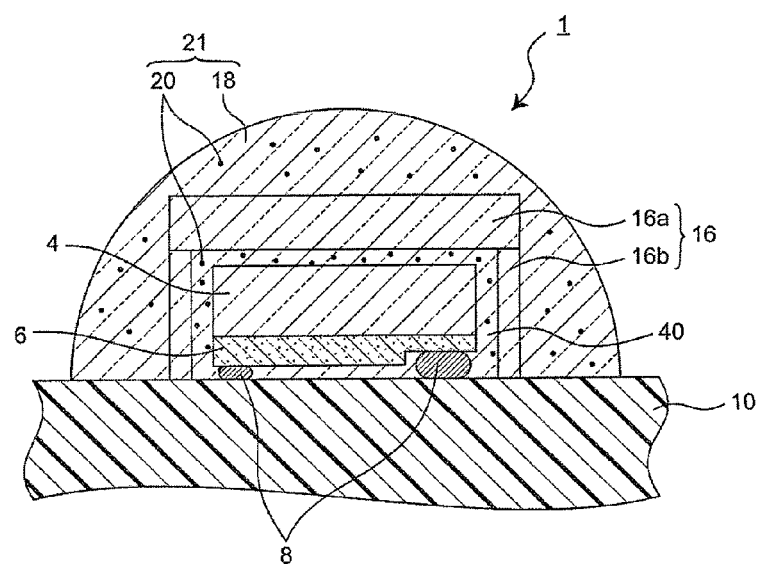
FIG. 7 is a schematic sectional view showing a light emitting device according to the fifth embodiment of the present invention.

FIG. 7 is a schematic sectional view showing a light emitting device according to the fifth embodiment of the present invention. In the present embodiment, the semiconductor light emitting element 2 is flip-chip mounted with the substrate 4 facing up, and the sheet-shaped fluorescent material layer 16a is bonded onto the top surface of the substrate 4 via an adhesive layer 40. The sheet-shaped fluorescent material layer 16b is also bonded onto four side faces of the semiconductor light emitting element 2 via the same adhesive layer 40. The sheet-shaped fluorescent material layers 16a, 16b have box shape that opens at the bottom. This embodiment is similar to the first embodiment in other respects. Also in the present embodiment, the fluorescent material layer 16 has one flat light emitting surface that is nearly parallel to the principal surface of the semiconductor light emitting element 2 on the light emitting side thereof, and four flat light emitting surfaces that are nearly parallel to the side faces of the semiconductor light emitting element 2, similarly to the first embodiment.

In the present embodiment, the particles 20 formed from an inorganic material having a higher refractive index than that of the material of the adhesive layer 40 are dispersed in the adhesive layer 40 that bonds the sheet-shaped fluorescent material layers 16a, 16b and the semiconductor light emitting element 2. This constitution increases the effective refractive index of the adhesive layer 40, and therefore decreases the difference in effective refractive index in the interface between the semiconductor light emitting element 2 and the adhesive layer 40 and the interfaces between the adhesive layer 40 and the fluorescent material layers 16a, 16b, thereby increasing the critical angle of total reflection and decreasing the return light due to reflection. Also because blue light that has been scattered by the adhesive layer 40 enters the fluorescent material layers 16a, 16b, the fluorescent material layers 16a, 16b are excited more uniformly and emission intensity distribution of the fluorescent material layers 16a, 16b is improved. Also the primary light of the semiconductor light emitting element 2 is scattered twice in the adhesive layer 40 and in the scattering layer 21, and therefore emission intensity distribution of the semiconductor light emitting element 2 becomes more uniform. The efficiency of heat dissipation is also improved in the path from the semiconductor light emitting element 2 to the adhesive layer 40 and the fluorescent material layers 16a, 16b.

The sheet-shaped fluorescent material layers 16a, 16b used in the present embodiment are preferably formed from an inorganic material, particularly an inorganic material that has heat conductivity of 0.8 W/mK or more, preferably 1.0 W/mK or more, and more preferably 4.0 W/mK or more. Specifically, the fluorescent material layers 16a, 16b may be formed from a crystal or an amorphous material of the inorganic fluorescent material, or the fluorescent material layers 16a, 16b may be formed by including inorganic fluorescent material particles in a transparent member formed from an inorganic material such as glass or alumina. An example of the fluorescent material layer s 16a, 16b formed from a crystal or amorphous material of the inorganic fluorescent material is a sheet-shaped body formed from crystal of fluorescent material having garnet structure activated with cerium. When the inorganic fluorescent material particles are contained in a transparent member formed from an inorganic material, an amorphous material such as glass, inorganic crystal or ceramics may be used as the transparent member of the inorganic material. When the fluorescent material layers 16a, 16b are formed from such a material, durability of the fluorescent material layers 16a, 16b itself is improved and heat dissipation from the fluorescent material layers 16a, 16b toward the mounting substrate 10 is improved, so that the light emitting device 1 of higher reliability can be realized. In order that the fluorescent material layers 16a, 16b have "sheet shape", the overall shape may be sheet shape that may have recess or hole in the surface thereof, and a pattern for achieving some optical effect may be formed on the surface. When fluorescent material layers 16a, 16b have "sheet shape", it is not limited to square and may have various shapes such as round or oval in a plan view. The sheet-shaped fluorescent material layer 16 is preferably disposed in parallel to the principal surface of the substrate of the semiconductor light emitting element 2. If the fluorescent material layer 16 has sheet shape, the fluorescent material layer 16 can be formed simply by bonding the sheet-shaped body onto the semiconductor light emitting element 2. When the fluorescent material layer 16 is formed in sheet shape, it becomes easier to assemble the light emitting device since the fluorescent material layer 16 can be prepared in a sheet member having a little larger size which may be cut into a desired size and used to manufacture the light emitting device 1.

The fluorescent material layer 16b formed on the side face of the semiconductor light emitting element 2 may be formed by printing or the like, not by bonding a sheet-shaped member. The particles 20 dispersed in the bonding layer 40 may be the same as or different from the particles 20 dispersed in the scattering layer 21, as long as Inequality 1 is satisfied.

Sixth Embodiment

Figure 8:
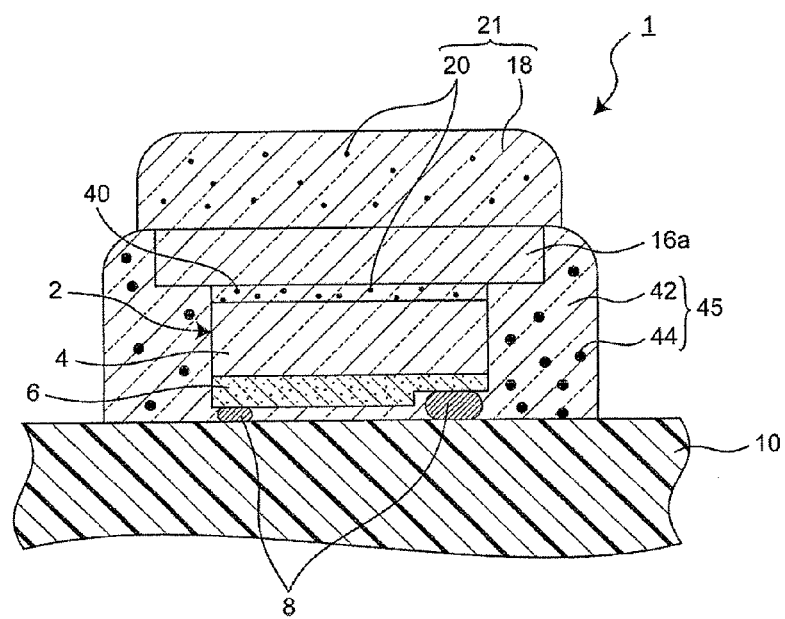
FIG. 8 is a schematic sectional view showing a light emitting device according to the sixth embodiment of the present invention.

FIG. 8 is a schematic sectional view showing a light emitting device 1 according to the sixth embodiment of the present invention. In the present embodiment, a reflecting member 45 is formed to reflect the secondary light of the fluorescent material layer 16a together with the primary light, while scattering the light, instead of the fluorescent material layer 16b formed on the side face of the semiconductor light emitting element 2. The scattering layer 21 coats only the top surface of the fluorescent material layer 16a that is disposed upward the semiconductor light emitting element 2, and is not formed on the side of the semiconductor light emitting element 2. Thus, in the present embodiment, the secondary light from the fluorescent material layer 16a is extracted through one flat light extracting surface that is nearly parallel to the principal surface of the semiconductor light emitting element 2. In this case, too, for a reason similar to that described in the first embodiment, the secondary light has higher intensity in the oblique direction than in the direction perpendicular to the principal surface of the semiconductor light emitting element 2, so that emission intensity distribution of the secondary light of the fluorescent material layer 16 shows a trend opposite to the emission intensity distribution of the primary light of the semiconductor light emitting element 2. Therefore, color unevenness is likely to occur according to the reason similar to the first to fifth embodiments. This embodiment is similar to the fifth embodiment in other respects.

When the fluorescent material layer 16a has sheet shape as in the present embodiment, emission intensity tends to increase on the end faces of the sheet, in consideration of the distribution within plane. Accordingly, when the fluorescent material layer 16a has sheet shape and is fastened onto the top surface of the semiconductor light emitting element as in the present embodiment, it is preferable to form the scattering layer 21 on the top surface of the fluorescent material layer 16a, and provide the reflecting member 45 on the side face of the fluorescent material layer 16a so as to reflect the secondary light of the fluorescent material layer 16a by the reflecting member 45 while scattering the light. It is preferred that the reflecting member 45 is also provided on the side face of the semiconductor light emitting element 2, as shown in FIG. 8.

In the reflecting member 45, scattering particles 44 having relatively large particle size are dispersed in a resin 42. Mean particle size of the scattering particles 44 is set to such a level that causes Mie scattering or diffraction scattering of blue light emitted by the semiconductor light emitting element 2, so that both the blue light emitted by the semiconductor light emitting element 2 and light of longer wavelength emitted by the fluorescent material layer 16a are scattered. Specifically, mean particle size D' of the scattering particles 44 is set to 70 nm or more, preferably 200 nm or more. When the mean particle size of the scattering particles 44 is 70 nm or more, visible light can be subjected to Mie scattering or diffraction scattering, if the transparent medium 42 has refractive index of 1.4 or higher. While the scattering layer 21 selectively scatter the primary light of the semiconductor light emitting element, the reflecting member 45 can reflect both the primary light of the semiconductor light emitting element 2 and the secondary light of the fluorescent material layer 16a, on the reflecting member 45 while scattering the light. The scattering particles 44 of the reflecting member 45 may be formed from a material similar to that of the particles 20 of the scattering layer 21 with a larger mean particle size, so as to function in the Mie scattering or diffraction scattering regime. The resin 42 of the reflecting member 45 may also be a material similar to that of the transparent medium 18 of the scattering layer 21.

The reflecting member 45 is formed on the side of the semiconductor light emitting element 2. Therefore the reflecting member 45 is capable of reflecting the primary light emitted from the side face of the semiconductor light emitting element 2 and the secondary light emitted from the side face and bottom surface of the fluorescent material layer 16a while scattering the light, so that emission with less color unevenness can be obtained. On the other hand, blue light emitted from the top surface of the semiconductor light emitting element 2 passes through the fluorescent material layer 16a and then through the scattering layer 21 that selectively scatters the primary light of the semiconductor light emitting element 2, and emits therefrom. According to the present embodiment, the light emitting device having less color unevenness can be made in a simpler constitution than that of the fifth embodiment. It is preferable that the reflecting member 45 coats not only the side faces of the semiconductor light emitting element 2 but also the side face of the plate-shaped fluorescent material layer 16a. This is because light emitted from the side face of the sheet-shaped fluorescent material layer 16a includes light of longer wavelengths in higher proportion to the blue light of the semiconductor light emitting element 2, and is likely to cause color unevenness. In the constitution shown in FIG. 8, top surface of the sheet-shaped fluorescent material layer 16a is coated by the scattering layer 21, while the side faces and a part of the bottom surface are coated by the reflecting member 45. It is preferable that the reflecting member 45 coats the periphery of the semiconductor light emitting element 2 and the fluorescent material layer 16 in an isotropic manner in plan view.

In the present embodiment, since the side faces of the semiconductor light emitting element 2 are exposed without being coated by the fluorescent material layer 16, the proportion of the primary light of the semiconductor light emitting element 2 that is absorbed by the fluorescent material layer 16 is reduced and light extracting efficiency can be improved.

Seventh Embodiment

Figure 9:
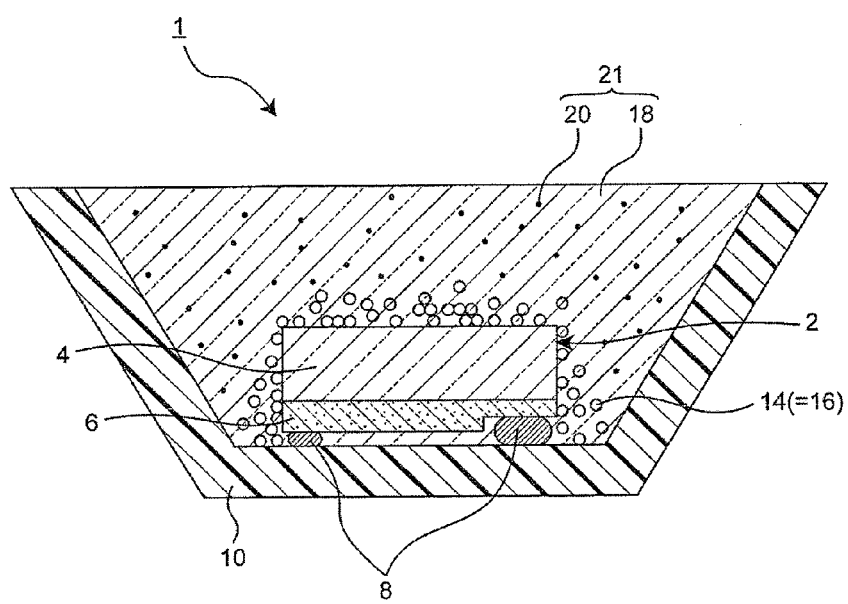
FIG. 9 is a schematic sectional view showing a light emitting device according to the seventh embodiment of the present invention.
Figure 10:
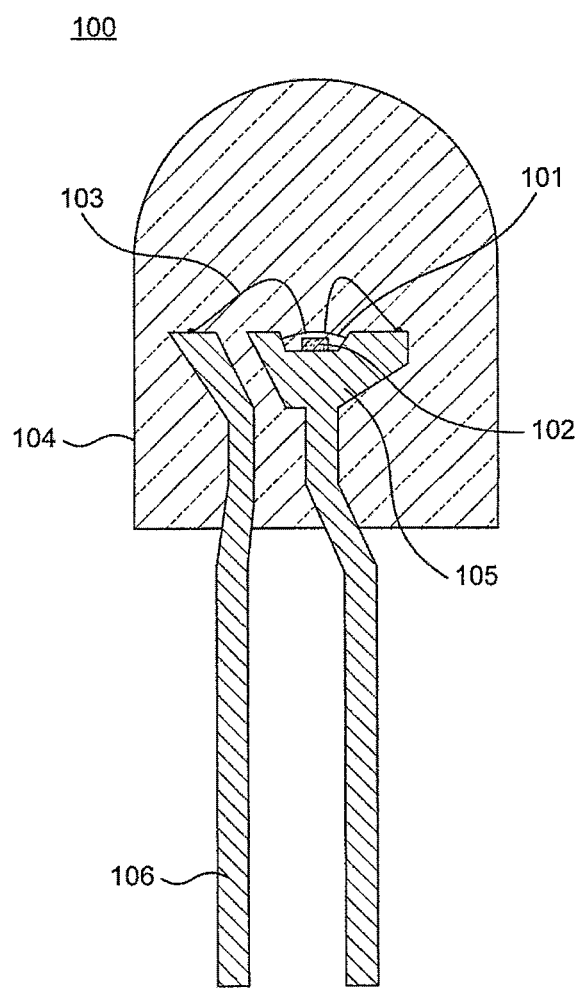
FIG. 10 is a schematic sectional view showing a light emitting device of the prior art.

FIG. 9 is a schematic sectional view showing a light emitting device 1 according to the seventh embodiment of the present invention. In the present embodiment, a concave mounting substrate 10 having inverse trapezoidal shape in the cross section with the surface thereof formed as reflecting mirror is used. After mounting the semiconductor light emitting element 2 on the mounting substrate 10, the transparent medium 18 containing both the fluorescent material particles 14 and the particles 20 mixed therein is potted and the fluorescent material particles 14 are allowed to precipitate. This embodiment is similar to the first embodiment in other respects.

According to the present embodiment, the fluorescent material layer 16 and the scattering layer 21 can be formed simultaneously with a simple manufacturing method. In the present embodiment, the fluorescent material layer 16 is constituted from fluorescent material particles 14 that precipitate so as to coat the top surface and the side faces of the semiconductor light emitting element 2. To manufacture the light emitting device 1 by the method of the present embodiment, a material having sufficiently low viscosity before curing may be used for the transparent medium 18, so that the fluorescent material particles 14 precipitate when potted on the mounting substrate 10 whereon the semiconductor light emitting element 2 has been mounted. The particles 20 have smaller particle size and therefore do not precipitate. Thus according to the present embodiment, the fluorescent material layer 16 and the scattering layer 21 can be formed simultaneously in a single manufacturing process. When the fluorescent material layer 16 is formed by causing the fluorescent material particles 14 to precipitate, absorption loss of the primary light and the secondary light in the fluorescent material layer 16 can be reduced, favorably. The fluorescent material particles 14 having spherical shape precipitate more easily as compared with the uneven shape.

The embodiments described above are mere examples, and the present invention is not restricted to these embodiments. For example, the fluorescent material layer 16 explained in the fifth embodiment may be formed in the light emitting device of the first through fourth embodiments, and the fluorescent material layer 16 explained in the first through sixth embodiments may be mounted on the mounting substrate 10 of the seventh embodiment. Components of the present invention are not limited to the constitution based on the members of the embodiments described above, and a plurality of components of the present invention may be constituted from a single member, or one component may be constituted from a plurality of members.

DESCRIPTION OF REFERENCE NUMERALS

1: Light emitting device
2: Semiconductor light emitting element
4: Substrate
6: Semiconductor layer
8: Solder bump
10: Mounting substrate
12: Fluorescent material holding member
14: Fluorescent material particles
16: Fluorescent material layer
18: Transparent medium
20: Particles
21: Scattering layer
22: n-side nitride semiconductor layer
24: Active layer
26: p-side nitride semiconductor layer
28: p-side electrode
30: p-side pad electrode
32: n-side electrode
34: Insulating protective film
36: Wire
38: Die-bonding material
40: Adhesive layer
42: Resin
44 Scattering particles
45 Reflecting member

What is claimed is:
1. A method of manufacturing a light emitting device comprising:
disposing a semiconductor light emitting element including a semiconductor layer that emits a primary light on a mounting substrate;
covering the semiconductor light emitting element with a transparent medium containing fluorescent material particles that absorb a part of the primary light and emits a secondary light having a wavelength longer than that of the primary light and scattering particles having a mean particle size D that satisfies Inequality 1:

$$20 \text{ nm} < D \leq 0.4 \times \lambda/\pi \qquad \text{[Inequality 1]}$$

where λ is the wavelength of the primary light propagating in the transparent medium; and
precipitating the fluorescent material particles so as to form a fluorescent layer where the fluorescent material particles are mainly dispersed in the transparent medium and a scattering layer where the scattering particles are mainly dispersed in the transparent medium.

2. The method of manufacturing a light emitting device according to claim 1, wherein the mount substrate forms a recess having inverse trapezoidal shape in the cross section.

3. The method of manufacturing a light emitting device according to claim 1, wherein the scattering particles are formed from an inorganic material having a higher refractive index than that of the transparent medium.

4. The method of manufacturing a light emitting device according to claim 1, wherein the semiconductor light emitting element includes a substrate, and a difference in an effective refractive index between the scattering layer and the substrate of the semiconductor light emitting element is 0.2 or less.

5. The method of manufacturing a light emitting device according to claim 1, wherein the scattering particles contain an oxide, sulfide or nitride having a higher refractive index than that of the transparent medium.

6. The method of manufacturing a light emitting device according to claim 1, wherein the scattering particles comprise at least one kind selected from the group consisting of titanium oxide, niobium oxide, aluminum oxide, yttrium oxide, zirconium oxide, diamond, tantalum oxide, cerium oxide, yttrium aluminum garnet, yttrium vanadate, zinc sulfide and silicon nitride.

7. The method of manufacturing a light emitting device according to claim 1, wherein the transparent medium comprises at least one kind selected from the group consisting of a silicone resin, a modified silicone resin, an epoxy resin, a modified epoxy resin, an acrylic resin and a hybrid resin containing these resins.

8. The method of manufacturing a light emitting device according to claim 1, wherein a peak wavelength of the primary light emitted by the semiconductor light emitting element is from 420 to 500 nm.

* * * * *